United States Patent
Yu et al.

(10) Patent No.: US 7,816,252 B2
(45) Date of Patent: Oct. 19, 2010

(54) METHOD FOR FORMING BUMPS ON UNDER BUMP METALLURGY

(75) Inventors: Jui I Yu, Kaohsiung (TW); Li Cheng Tai, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 64 days.

(21) Appl. No.: 12/199,638

(22) Filed: Aug. 27, 2008

(65) Prior Publication Data

US 2009/0061614 A1 Mar. 5, 2009

(30) Foreign Application Priority Data

Aug. 28, 2007 (TW) .............................. 96131780 A (51) Int. Cl.
  *H01L 21/44* (2006.01)
(52) U.S. Cl. ........................ 438/614; 257/738; 257/781; 257/E21.508; 257/E23.021
(58) Field of Classification Search ................. 438/613, 438/614; 257/738, 780, 781, E21.508, E23.021
See application file for complete search history.

(56) References Cited

U.S. PATENT DOCUMENTS

| | | | | |
|---|---|---|---|---|
| 5,418,186 A | * | 5/1995 | Park et al. | 438/614 |
| 5,767,010 A | * | 6/1998 | Mis et al. | 438/614 |
| 5,937,320 A | * | 8/1999 | Andricacos et al. | 438/614 |
| 6,293,457 B1 | * | 9/2001 | Srivastava et al. | 228/254 |

* cited by examiner

*Primary Examiner*—Mary Wilczewski
*Assistant Examiner*—Toniae M Thomas (57) ABSTRACT

A method for forming a bump on under bump metallurgy according to the present invention is provided. A bonding pad is first formed on the active surface of a wafer. Subsequently, a passivation layer is formed on the active surface of the wafer and exposes the bonding pad. An under bump metallurgy is formed on the bonding pad. A layer of film is formed on the passivation layer and overlays the under bump metallurgy. Afterward, the portion of the film on the under bump metallurgy is exposed to a UV light and the exposed portion of the film is removed to expose the under bump metallurgy. A solder paste is applied to the under bump metallurgy and the remaining film on the wafer is removed. Finally, the solder paste is reflowed to form a spherical bump.

19 Claims, 8 Drawing Sheets

METHOD FOR FORMING BUMPS ON UNDER BUMP METALLURGY

CROSS REFERENCE TO RELATED APPLICATION

This application claims the priority benefit of Taiwan Patent Application Serial Number 096131780 filed Aug. 28, 2007, the full disclosure of which is incorporated herein by reference.

BACKGROUND OF THE INVENTION

1. Field of the Invention

The invention relates to a method for forming bumps and more particularly, to a method for forming bumps on under bump metallurgy by micro-bubble film.

2. Description of the Related Art

It is common that a chip is electrically connected to external circuitry by wire-bonding in the art. However, more room is required to accommodate the bonding wires and the working frequency of the chip is also limited. Therefore, to solve the above problems, the flip-chip bonding technology has been developed to replace the conventional wire-bonding technology.

The so-called flip-chip bonding technology is first to form under bump metallurgy (UBM) on a chip and metal bumps are then formed on the under bump metallurgy. The chip can be connected to a substrate by the metal bumps with a reflow process.

Figure 1:
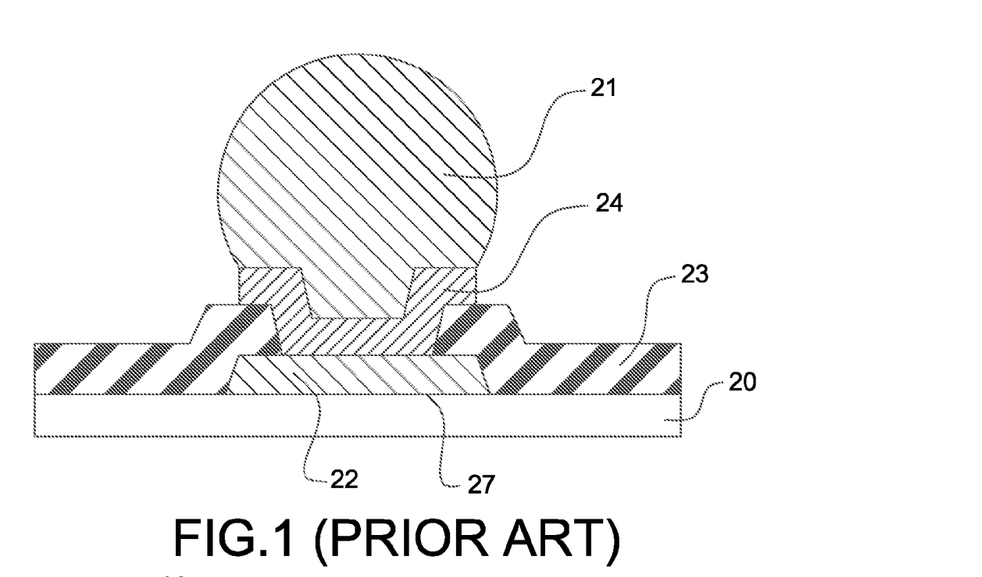
FIG. 1 is a cross-sectional view of a conventional metal bump formed on a wafer.

According to the above flip-chip bonding technology, the structure of a metal bump formed by the conventional technique is illustrated in FIG. 1. A bonding pad, such as an aluminum (Al) pad 22 is formed on the active surface 27 of a wafer 20. A passivation layer 23 acting as an isolation layer is formed to overlay the active surface 27 of the wafer 20 and expose the bonding pad 22. An under bump metallurgy 24 is formed on the bonding pad 22. A metal bump 21 is then formed on the under bump metallurgy 24.

Figure 2:
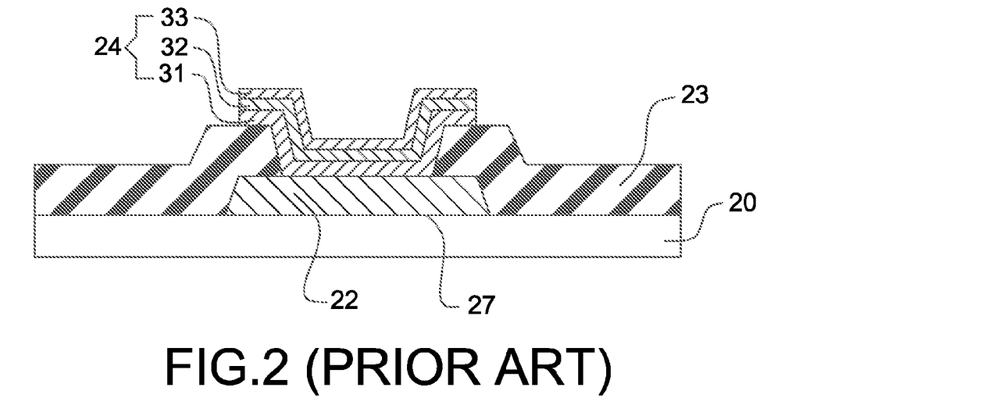
FIG. 2 is a cross-sectional view of a conventional under bump metallurgy of three layers.
Figure 3A:
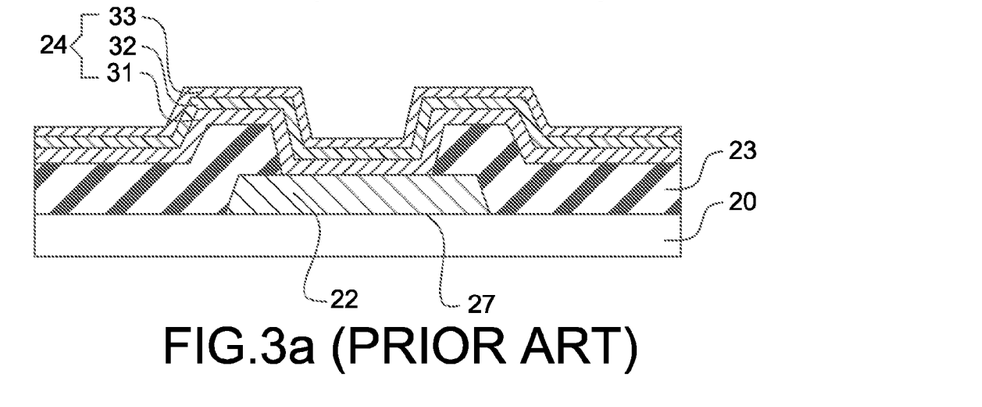
FIGS. 3a to 3j illustrate the conventional method for forming metal bumps.
Figure 3B:
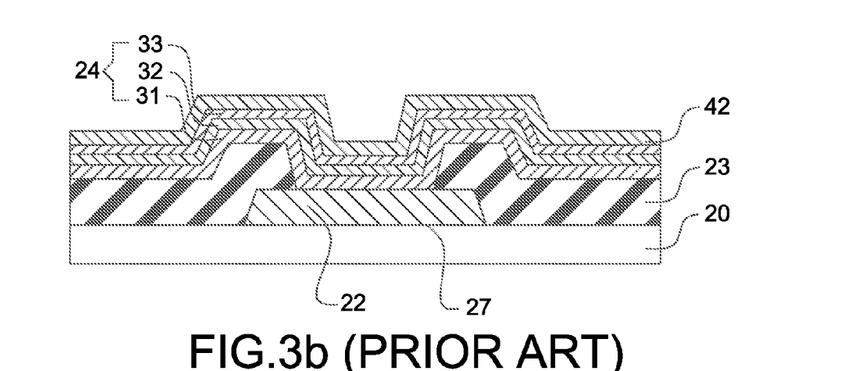
Figure 3C:
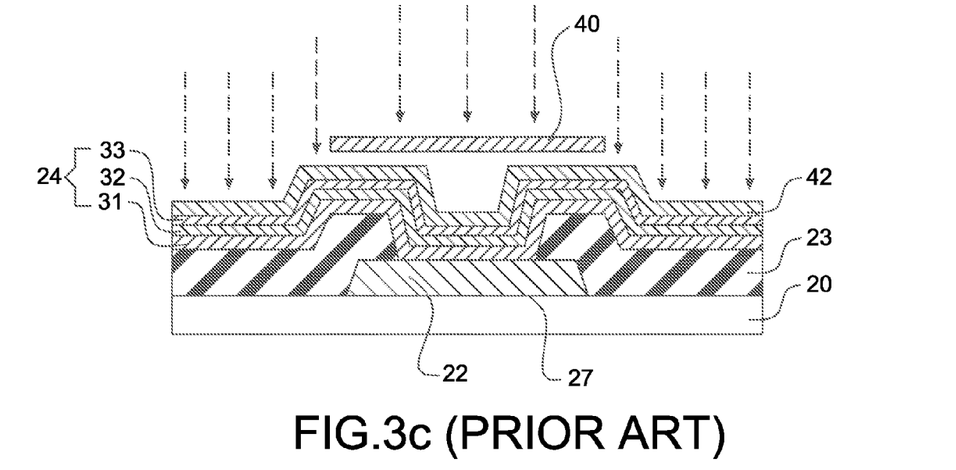
Figure 3D:
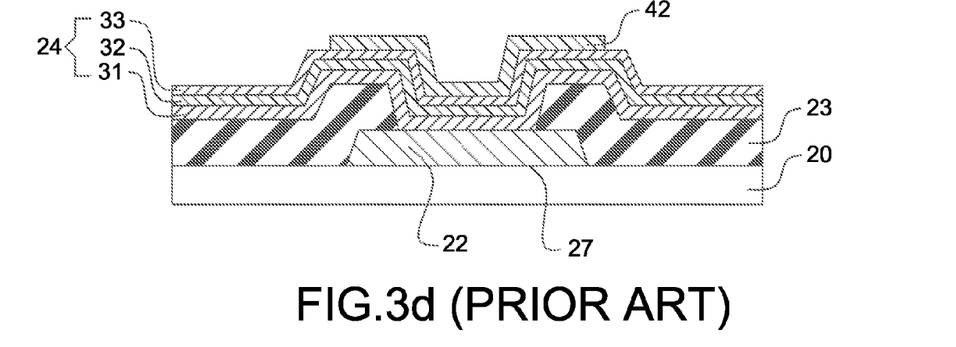
Figure 3E:
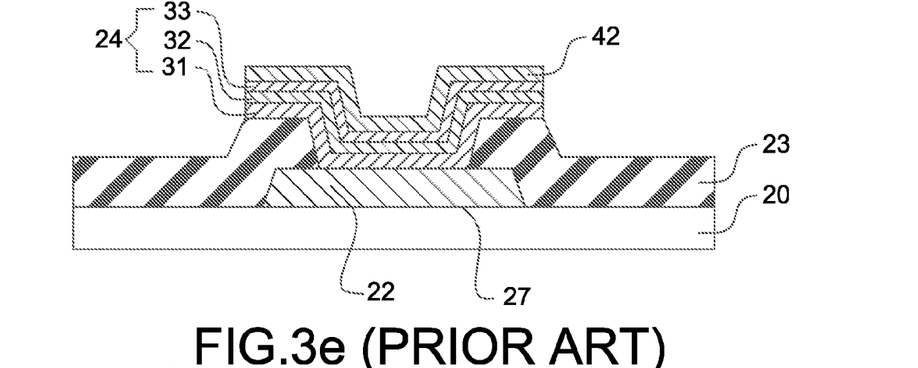
Figure 3F:
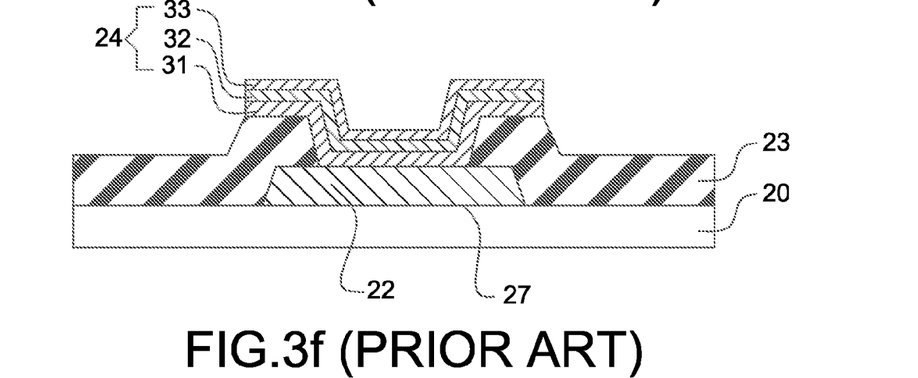
Figure 3G:
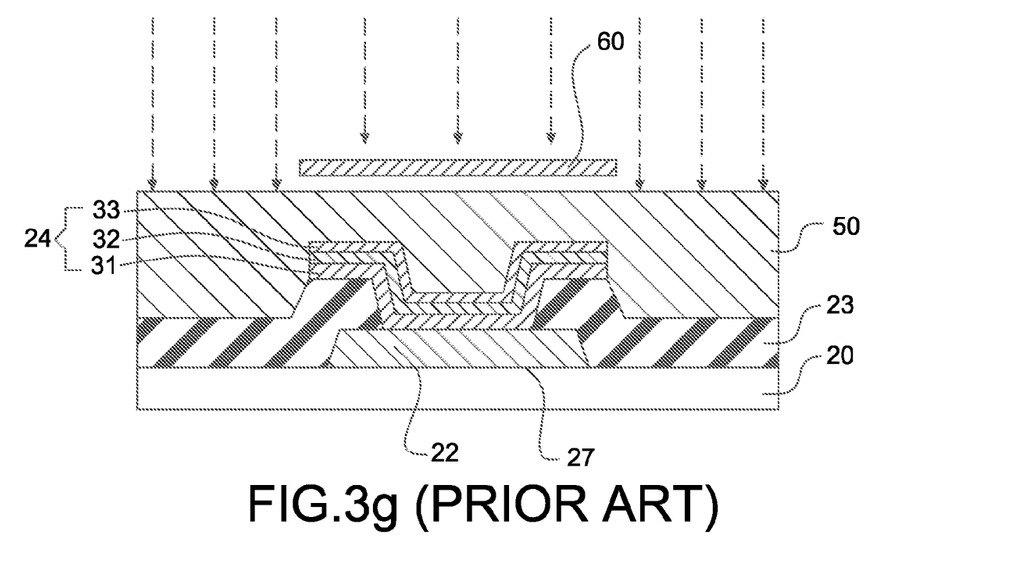
Figure 3H:
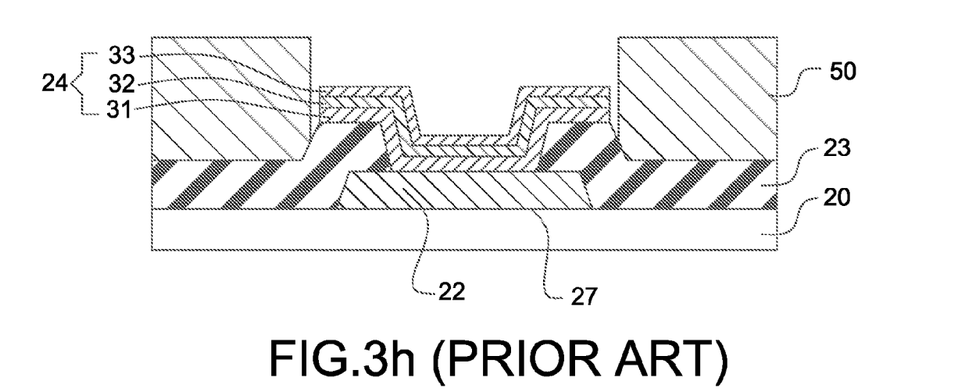
Figure 3I:
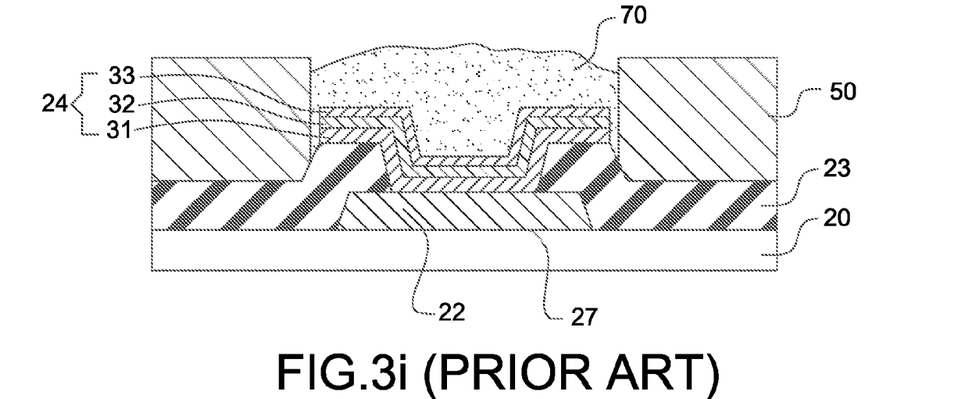
Figure 3J:
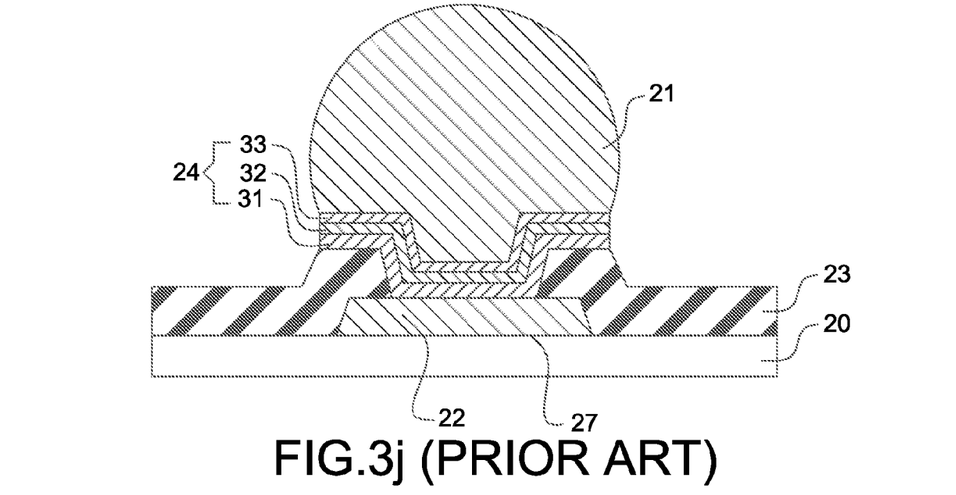

Referring to FIG. 2, the above under bump metallurgy 24 typically includes three layers. The uppermost layer of the under bump metallurgy 24 is a wetting layer 33 made of such as copper. The function of the wetting layer 33 is to provide a good bonding with a metal bump 21 made of stannum (Sn). The lowermost layer of the under bump metallurgy 24 is an adhesive layer 31. The function of the adhesive layer 31 is to provide a firm bonding with the aluminum pad 22. The middle layer of the under bump metallurgy 24 is a barrier layer 32 made of such as nickel/vanadium (NiV). The function of the barrier layer 32 is to prevent the wetting layer 33 from wetting the adhesive layer 31.

Referring to FIGS. 3a to 3j, the conventional method for forming a metal bump is to form a bonding pad 22 on the active surface 27 of a wafer 20. A passivation layer 23 is then formed on the active surface 27 of the wafer 20 and exposes the bonding pad 22. Afterward, an under bump metallurgy 24 is formed on the passivation layer 23 to overlay the bonding pad 22 (see FIG. 3a). A positive-type photoresist layer 42 is formed on the under bump metallurgy 24 (see FIG. 3b). Subsequently, a photomask 40 is positioned above the bonding pad 22 and a selective exposure process is performed on the photoresist layer 42. As a result, the portion of the photoresist layer 42 under the photomask 40 is not exposed to an ultraviolet light due to the shielding of the photomask 40 and therefore remains unchanged. The portion of the photoresist layer 42 exposed from the photomask 40 chemically reacts with the ultraviolet light (see FIG. 3c). The wafer 20 is then placed in a developing machine to have the portion of the photoresist layer 42 chemically reacting with the ultraviolet light removed by the developer (see FIG. 3d). Afterward, an etching solution, such as copper etching solution and aluminum etching solution is used to etch out the portion of the under bump metallurgy 24 not covered by the photoresist layer 42 (see FIG. 3e). Subsequently, the photoresist layer 42 is removed (see FIG. 3f). After the photoresist layer 42 is removed, a negative-type photoresist layer 50 is formed on the active surface 27 of the wafer 20. Next, a photomask 60 is positioned above the bonding pad 22 and a selective exposure process is performed on the photoresist layer 50. Consequently the portion of the photoresist layer 50 under the photomask 60 is not exposed to a light due to the shielding of the photomask 60 while the portion of the photoresist layer 50 exposed from the photomask 60 carries out a chemical reaction with the light (see FIG. 3g). The portion of the photoresist layer 50 not exposed to the light is then washed out by a developer and the portion of the photoresist layer 50 chemically reacting with the light still remains on the wafer 20 (see FIG. 3h). Afterward, a layer of solder paste 70 is applied to the portion of the under bump metallurgy 24 exposed from the photoresist layer 50 and the wafer 20 is subjected to a reflow process to have the solder paste 70 preformed a solder ball (see FIG. 3i). A strong base solution is then used to remove the remaining photoresist layer 50. The wafer 20 is subjected to a reflow process again to have the solder paste 70 formed a spherical metal bump 21 (see FIG. 3j).

According to the above method of using a strong base solution to remove the remaining photoresist layer 50, the strong base solution not only is expensive but also corrodes the under bump metallurgy 24 and passivation layer 23.

Accordingly, there exists a need to provide a method for forming bumps to solve the above-mentioned problems.

SUMMARY OF THE INVENTION

It is an object of the present invention to provide a method for forming bumps, wherein the remaining micro-bubble film can be easily torn off with a de-taping machine. There is no need to use the convention strong base solution to remove the remaining micro-bubble film. This avoids the corrosion of the under bump metallurgy and passivation layer.

In order to achieve the above object, the method for forming bumps according to the present invention is to form a bonding pad on the active surface of a wafer. A passivation layer is then formed on the active surface of the wafer and exposes the bonding pad. Afterward, an under bump metallurgy is formed on the bonding pad. A layer of film is formed on the passivation layer and overlays the under bump metallurgy. A photomask is positioned above the film and a UV light is used to perform a selective exposure process on the film. As a result, the portion of the film right above the under bump metallurgy is exposed to the UV light and therefore chemically reacts with it. The portion of the film not right above the under bump metallurgy is not exposed to the UV light due to the shielding of the photomask. A developer is then used to remove the exposed portion of the film. Subsequently, a layer of solder paste is applied to the portion of the under bump metallurgy exposed from the film and the wafer is subjected to a first reflow process to preheat the solder paste. Next, the wafer is irradiated by the UV light again to have the remaining film on the wafer exposed to the UV light. A de-taping machine is then used to tear all the remaining film from the wafer. The wafer is subjected to a second reflow process to have the solder paste formed into a spherical metal bump.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 4A:
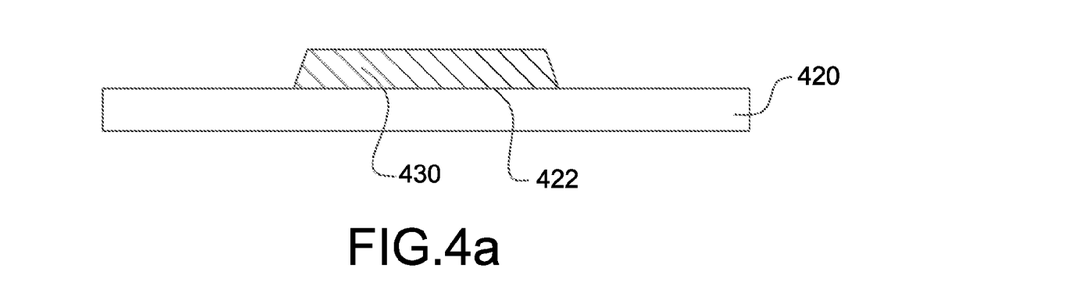
FIGS. 4a to 4i illustrate the method for forming bumps according to the present invention.
Figure 4B:
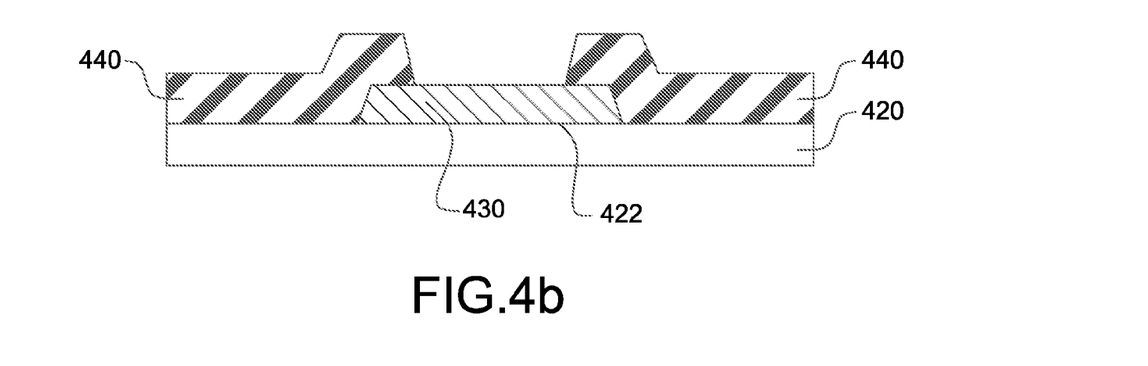
Figure 4C:
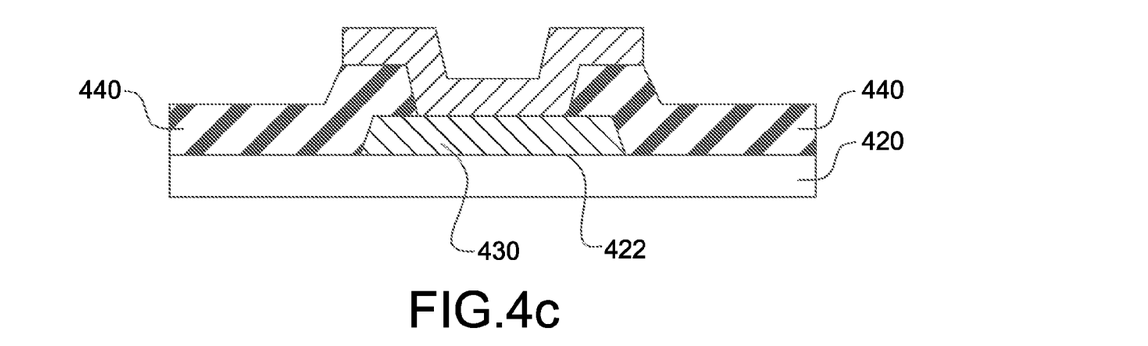

Referring to FIGS. 4a to 4i, the method for forming a bump according to the present invention is to form a bonding pad 430 on the active surface 422 of a wafer 420 (see FIG. 4a). A passivation layer 440 is then formed on the active surface 422 of the wafer 420 and exposes the bonding pad 430 (see FIG. 4b). The passivation layer 440 can be made of polyimide (PI) or bis-Benzo-Cyclo-Butene (BCB). Afterward, the steps illustrated above in FIGS. 3b to 3f is used to form an under bump metallurgy 450 on the active surface 422 of the wafer 420 to overlay the bonding pad 430 (see FIG. 4c). More specifically, the under bump metallurgy 450 is first formed and a photoresist layer is then formed on the under bump metallurgy 450. Subsequently, the photoresist layer is subjected to a selective exposure, development and etching processes in sequence. The resulting under bump metallurgy 450 is illustrated in FIG. 4c.

Figure 4D:
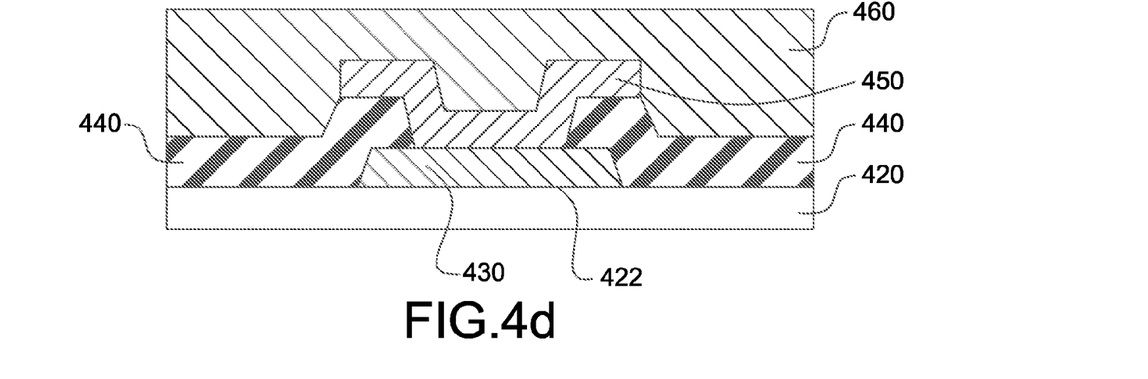
Figure 4E:
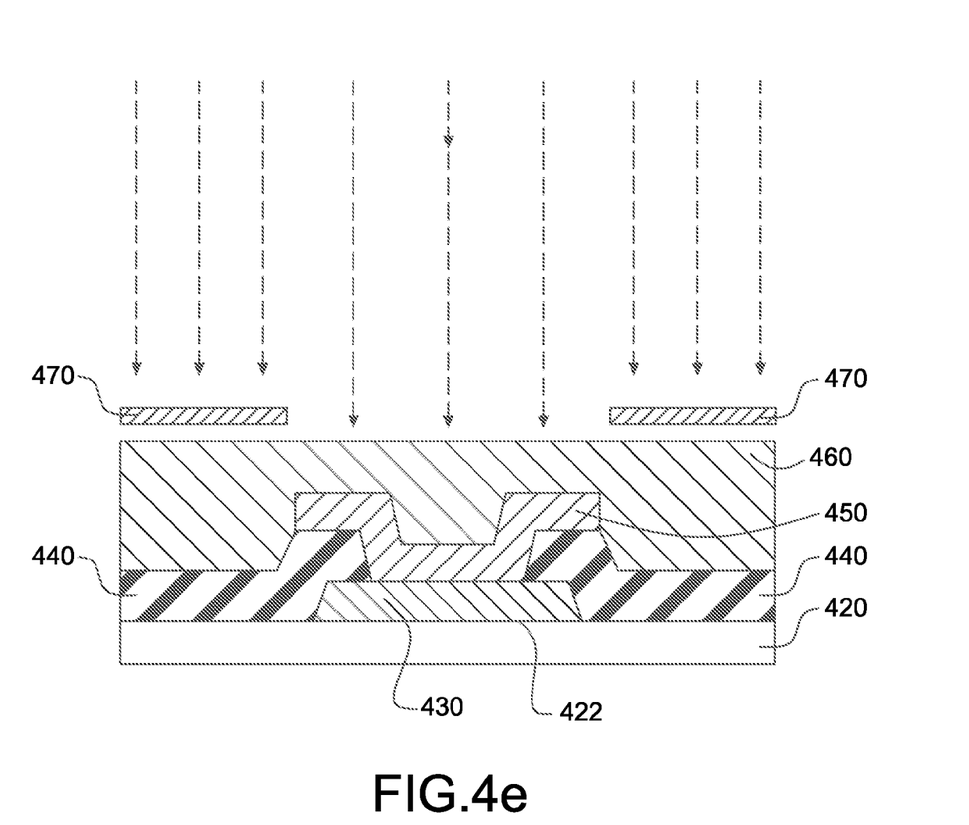
Figure 4F:
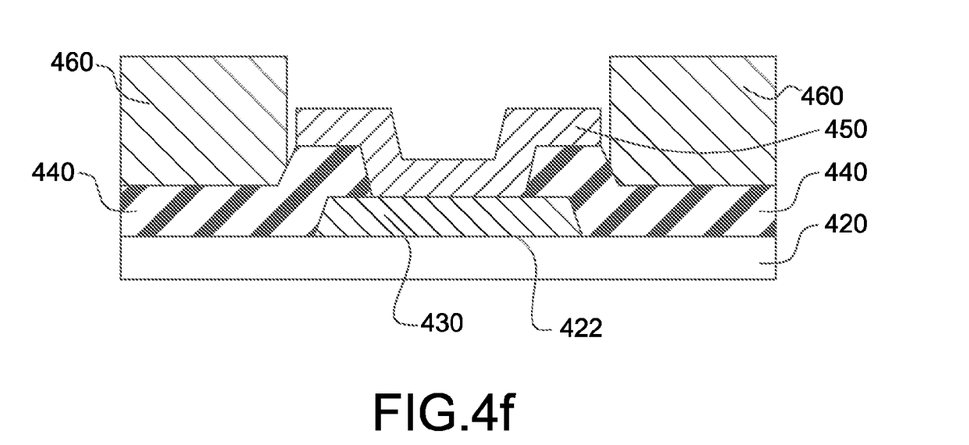
Figure 4G:
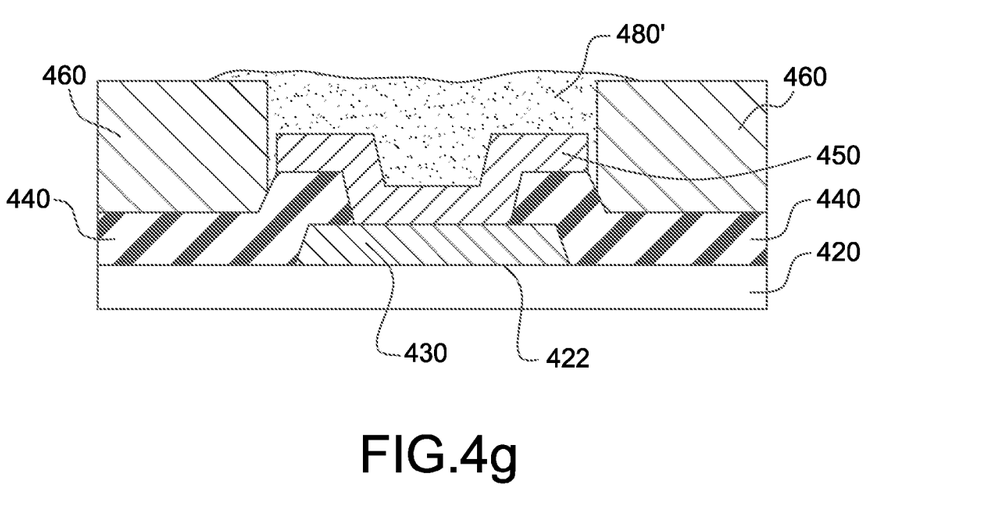
Figure 4H:
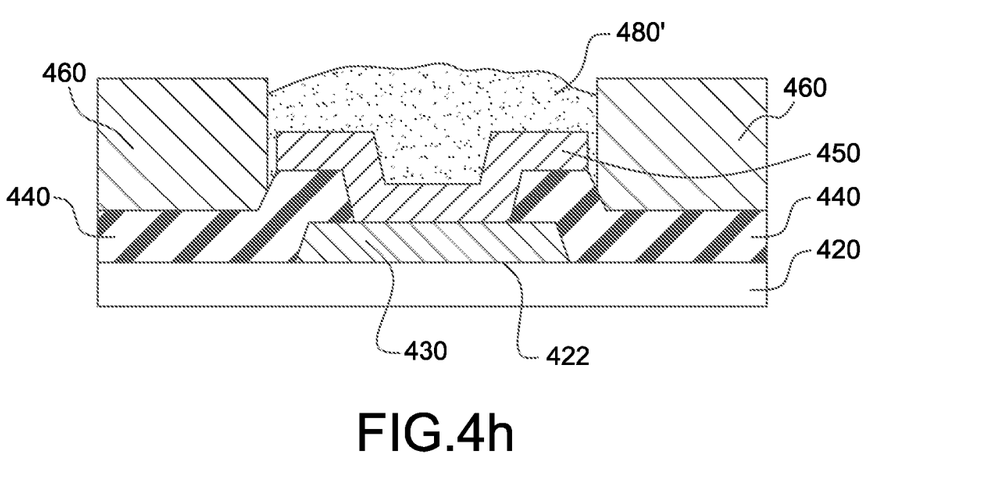

Next, a layer of film 460, such as a micro-bubble film is formed on the active surface 422 of the wafer 420 to overlay the under bump metallurgy 450 (see FIG. 4d). A photomask 470 is positioned above the film 460 and an ultraviolet (UV) light is used to perform a selective exposure process on the film 460. As a result, the portion of the film 460 right above the under bump metallurgy 450 is exposed to the UV light and therefore chemically reacts with it. The portion of the film 460 not right above the under bump metallurgy 450 is not exposed to the UV light due to the shielding of the photomask 470 (see FIG. 4e). Since the portion of the film 460 exposed to the UV light has bubbles formed therein and therefore the adhesion thereof is reduced, a developer can easily remove the exposed portion of the film 460 (see FIG. 4f). Afterward, a layer of solder paste 480' is applied to the portion of the under bump metallurgy 450 exposed from the film 460 by printing (see FIG. 4g). The wafer 420 is then subjected to a first reflow process to preheat the solder paste 480' (see FIG. 4h). Subsequently, the wafer 420 is irradiated by the UV light again to have the remaining film 460 on the wafer 420 exposed to the UV light. The remaining film 460 will have bubbles formed therein and the adhesion thereof with the wafer 420 is therefore reduced. A de-taping machine is then used to tear all the remaining film 460 from the wafer 420. The wafer 420 is subjected to a second reflow process to have the solder paste 480' formed into a spherical metal bump 480 (see FIG. 4i).

Figure 4I:
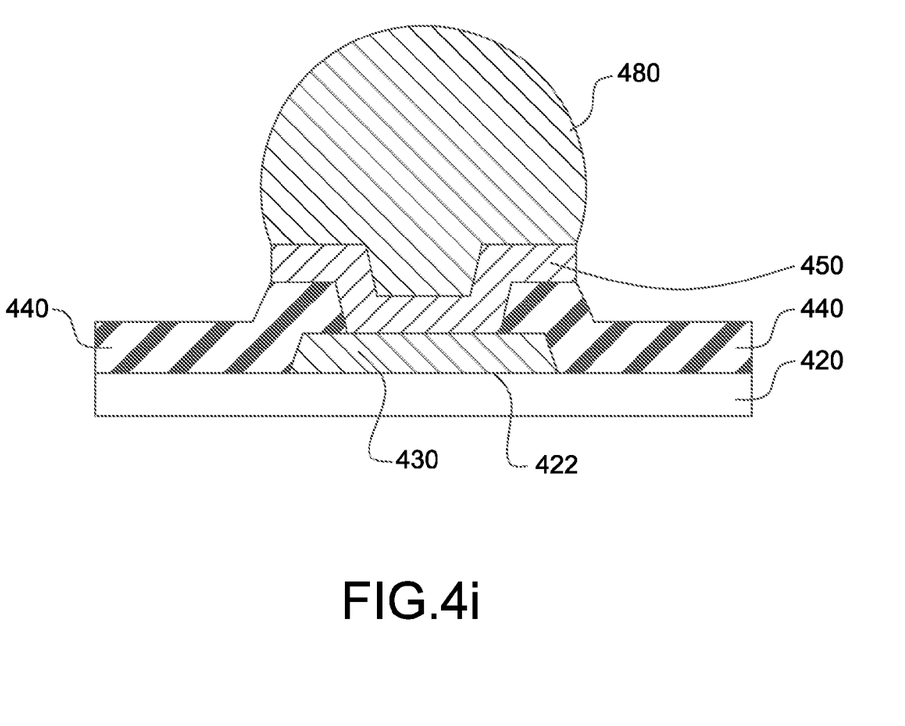

According to the method of the present invention, the film 460 can be easily torn off with a de-taping machine after being exposed to a UV light. Accordingly, there is no need to use the conventional strong base solution to remove the film 460. This can avoid the corrosion of the under bump metallurgy 450 and passivation layer 440.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a bump, comprising the steps of:
   providing a wafer having an active surface and at least one bonding pad formed on the active surface;
   forming a passivation layer on the active surface of the wafer and exposing the bonding pad;
   forming an under bump metallurgy on the bonding pad;
   forming a layer of film on the passivation layer to overlay the under bump metallurgy;
   performing an exposure process on the film, subjecting a portion of the film directly above the under bump metallurgy to a first exposure;
   removing the exposed portion of the film, exposing the under bump metallurgy and retaining an unexposed portion of the film;
   applying a layer of solder paste to the under bump metallurgy;
   removing the retained portion of the film from the wafer by a de-taping machine; and
   performing a second reflow process to have the solder paste formed into a bump.

2. The method as claimed in claim 1, wherein the film is a micro-bubble film.

3. The method as claimed in claim 1, wherein the portion of the film subjected to the first exposure is removed by a developer.

4. The method as claimed in claim 1, wherein a photomask is used to perform the exposure process on the film.

5. The method as claimed in claim 2, wherein a photomask is used to perform the exposure process on the film.

6. The method as claimed in claim 1, wherein the solder paste is applied to the under bump metallurgy by printing.

7. A method for forming a bump comprising the steps of:
   providing a wafer having an active surface and at least one bonding pad formed on the active surface;
   forming a passivation layer on the active surface of the wafer and exposing the bonding pad;
   forming an under bump metallurgy on the bonding pad;
   forming a film layer on the passivation layer overlaying the under bump metallurgy;
   performing an exposure process on the film, subjecting a portion of the film, directly above the under bump metallurgy, to a first exposure;
   removing the exposed portion of the film, exposing the under bump metallurgy and retaining an unexposed portion of the film as a remaining film;
   applying a layer of solder paste to the under bump metallurgy;
   performing a second exposure on the remaining film;
   removing the remaining film from the wafer by a de-taping machine; and
   performing a second reflow process forming the solder paste into a bump.

8. The method as claimed in claim 7, wherein the film is a micro-bubble film.

9. The method as claimed in claim 7, wherein the portion of the film subjected to the first exposure is removed by a developer.

10. The method as claimed in claim 7, wherein a photomask is used to perform the exposure process on the film.

11. The method as claimed in claim 8, wherein a photomask is used to perform the exposure process on the film.

12. The method as claimed in claim 7, wherein the solder paste is applied to the under bump metallurgy by printing.

13. A method for forming a bump, comprising the steps of:
- providing a wafer having an active surface and at least one bonding pad formed on the active surface;
- forming a passivation layer on the active surface of the wafer and exposing the bonding pad;
- forming an under bump metallurgy on the bonding pad;
- forming a layer of film on the passivation layer, overlaying the under bump metallurgy;
- performing an exposure process on the film so that a portion of the film directly above the under bump metallurgy is subjected to a first exposure;
- removing the exposed portion of the film to expose the under bump metallurgy and retaining an unexposed remaining portion of the film;
- applying a layer of solder paste to the under bump metallurgy;
- performing a first reflow process on the wafer;
- removing the remaining film from the wafer; and
- performing a second reflow process to have the solder paste formed into a bump.

14. The method as claimed in claim 13, wherein the film is a micro-bubble film.

15. The method as claimed in claim 13, wherein the remaining film is removed from the wafer by a de-taping machine.

16. The method as claimed in claim 13, wherein the portion of the film subjected to the first exposure is removed by a developer.

17. The method as claimed in claim 13, wherein a photomask is used to perform the exposure process on the film.

18. The method as claimed in claim 14, wherein a photomask is used to perform the exposure process on the film.

19. The method as claimed in claim 13, wherein the solder paste is applied to the under bump metallurgy by printing.

* * * * *